United States Patent
Feng et al.

(10) Patent No.: US 11,356,105 B2
(45) Date of Patent: Jun. 7, 2022

(54) METHOD FOR CALIBRATING CRYSTAL FREQUENCY OFFSET THROUGH INTERNAL LOOP OF CENTRAL PROCESSING UNIT

(71) Applicant: AMLOGIC (SHANGHAI) CO., LTD., Shanghai (CN)

(72) Inventors: Jie Feng, Shanghai (CN); Kun Zhang, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 572 days.

(21) Appl. No.: 16/342,048

(22) PCT Filed: Oct. 31, 2018

(86) PCT No.: PCT/CN2018/113143
§ 371 (c)(1),
(2) Date: Apr. 15, 2019

(87) PCT Pub. No.: WO2019/114449
PCT Pub. Date: Jun. 20, 2019

(65) Prior Publication Data
US 2021/0359690 A1   Nov. 18, 2021

(30) Foreign Application Priority Data
Dec. 12, 2017 (CN) .......................... 201711322494.5

(51) Int. Cl.
*H03B 5/32* (2006.01)
*G06F 1/08* (2006.01)
(Continued)

(52) U.S. Cl.
CPC ................ *H03L 7/099* (2013.01); *G06F 1/08* (2013.01); *H03B 5/323* (2013.01); *H03L 7/04* (2013.01); *H03B 2200/006* (2013.01)

(58) Field of Classification Search
CPC ........................... G06F 1/08; H03B 5/30–368
See application file for complete search history.

(56) References Cited

U.S. PATENT DOCUMENTS 5,160,901 A * 11/1992 Stone ....................... H03B 5/36
                                                          331/116 R
5,844,435 A * 12/1998 Grundvig .................. G06F 1/26
                                                          327/151

(Continued)

FOREIGN PATENT DOCUMENTS

| CN | 103457601 A | 12/2013 |
|---|---|---|
| GB | 2323225 A | 9/1998 |
| JP | 3673406 B2 | 7/2005 |

*Primary Examiner* — Levi Gannon
(74) *Attorney, Agent, or Firm* — Wolter Van Dyke Davis, PLLC; Robert L. Wolter

(57) ABSTRACT

The invention provides a method for calibrating crystal frequency offset through an internal loop of a central processing unit (CPU), which comprises: outputting an oscillation exciting signal to a crystal circuit by the CPU; producing a clock signal by the crystal circuit; outputting the clock signal through an output port arranged on the CPU by the internal loop; and adopting and connecting a frequency meter to the output port, and receiving and testing the clock signal to obtain a testing result; determining whether a deviation of the clock signal is qualified; if it is qualified, the tester exits subsequently, otherwise the tester regulates the crystal circuit, and then turning to Step S4. The clock signal of the CPU is output at the output port through the internal loop, and then the frequency meter is used for measuring the clock without being influenced by a probe, and the measurement is more accurate.

3 Claims, 2 Drawing Sheets

(51) Int. Cl.
*H03L 7/099* (2006.01)
*H03L 7/04* (2006.01)

(56) References Cited

U.S. PATENT DOCUMENTS

| | | | | |
|---|---|---|---|---|
| 8,686,802 | B1* | 4/2014 | Brown | G01N 29/036 |
| | | | | 331/154 |
| 9,749,962 | B1* | 8/2017 | Chi | G06F 1/3206 |
| 2011/0151856 | A1* | 6/2011 | Rebel | H03L 7/0991 |
| | | | | 455/422.1 |
| 2011/0187422 | A1* | 8/2011 | Hammes | H03B 5/32 |
| | | | | 327/156 |
| 2011/0285444 | A1* | 11/2011 | Uemura | H03B 5/32 |
| | | | | 327/299 |
| 2012/0235760 | A1* | 9/2012 | Yajima | H03B 5/30 |
| | | | | 331/154 |
| 2016/0134237 | A1* | 5/2016 | Lloyd | H03B 5/30 |
| | | | | 331/154 |
| 2017/0040942 | A1* | 2/2017 | Isohata | H03L 1/022 |
| 2018/0299410 | A1* | 10/2018 | Merrill | G01N 29/00 |

* cited by examiner

METHOD FOR CALIBRATING CRYSTAL FREQUENCY OFFSET THROUGH INTERNAL LOOP OF CENTRAL PROCESSING UNIT

CROSS-REFERENCE TO RELATED APPLICATIONS

The present application is a national phase of Ser. No. PCT/CN2018/113143 filed Oct. 31, 2018, the entire contents of which are incorporated herein by reference, and which claims priority to and the benefit of Chinese Patent Application No. 201711322494.5 filed Dec. 12, 2017.

BACKGROUND OF THE INVENTION

1. Field of the Invention

The invention relates to the field of communication technologies, and more particularly, to a method for calibrating crystal frequency offset through an internal loop of a central processing unit (CPU).

2. Description of the Related Art

At present, as a frequency of a high-speed signal becomes increasingly higher, the crystal frequency offset requires to be strictly small. When the load capacitance is incompatible with the crystal, an excessive large crystal frequency offset may occur and then the system may become instable, and performance of Radio Frequency (RF) may be affected to a larger extent. A problem is listed as follows: due to the fact that the clock of the crystal and the external load capacitance are designed based on the knowledge of experience, it is difficult to meet the requirement on high precision clock. Two technical solutions are put forward to solve the above-mentioned problem.

1. Directly measure the clock frequency on the transistor pin by using an oscilloscope, however, some problems can be found in the solution: the measurement is not accurate, the oscilloscope probe will affect the load capacitance, and thus, the offset is large.

2. Directly measure the clock frequency on the transistor pin by using a frequency meter, however, the load capacitance will be affected as well, leading to an inaccurate testing result.

SUMMARY OF THE INVENTION

Aiming at the foregoing problems in the prior art, the present invention provides a method for calibrating crystal frequency deviation through an internal loop of a CPU.

The technical solutions are as follows:

A method for calibrating crystal frequency offset through an internal loop of a central processing unit (CPU), wherein the CPU comprises the internal loop and a crystal circuit, wherein the method comprises:

Step S1, outputting an oscillation exciting signal to the crystal circuit by the CPU;

Step S2, producing a clock signal according to the oscillation exciting signal by the crystal circuit;

Step S3, outputting the clock signal through an output port arranged on the CPU by the internal loop; and Step S4, adopting a frequency meter and connecting the frequency meter to the output port, and receiving the clock signal and testing the clock signal by the frequency meter, to obtain a testing result;

determining whether a deviation of the clock signal is qualified according to the testing result by a tester;

if the result shows that the deviation of the clock signal is qualified, the tester exits subsequently;

if the result shows that that the deviation of the clock signal is unqualified, the tester regulates the crystal circuit, and then turning to Step S4.

Preferably, the crystal circuit comprises:

a passive crystal oscillator, wherein a first pin of the passive crystal oscillator is configured to input the clock signal to the internal loop, a third pin of the passive crystal oscillator is configured to receive the oscillation exciting signal output from the CPU, wherein a second pin and a fourth pin of the passive crystal oscillator are respectively grounded;

a first resistor, wherein the first resistor is connected in parallel with the circuit between the third pin and the fourth pin of the passive crystal oscillator;

a second resistor, wherein the third pin of the passive crystal oscillator is connected to the internal loop through the second resistor;

a first capacitor, the first pin of the passive crystal oscillator is grounded through the first capacitor; and a second capacitor, the third pin of the passive crystal oscillator is grounded through the second capacitor.

Preferably, the first capacitor is directly connected to the ground; and the second capacitor is directly connected to the ground CPU.

Preferably, in Step S4, for the step of the tester regulating the crystal circuit further comprises:

Step 4a, regulating a capacitance value of the first capacitor and/or the second capacitor, respectively.

The invention has the advantages that the clock signal of the CPU is output at the output port through the internal loop of the CPU, and then the frequency meter is used for measuring the clock without being influenced by a probe, and the measurement is more accurate.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
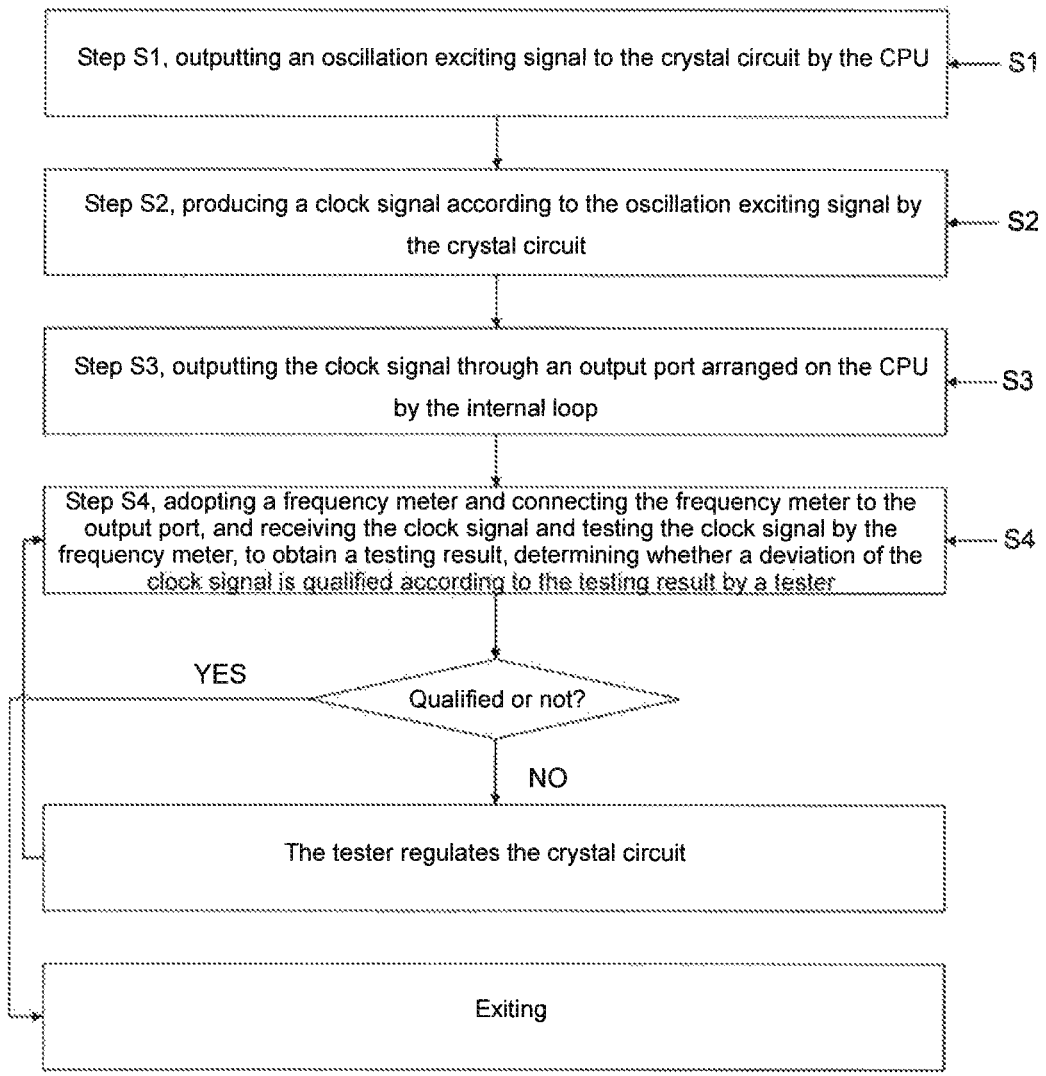
FIG. 1 is a flowchart of a method for calibrating crystal frequency offset through an internal loop of a CPU according to a preferred embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the term "plurality" means a number greater than one.

Hereinafter, certain exemplary embodiments according to the present disclosure will be described with reference to the accompanying drawings.

Figure 2:
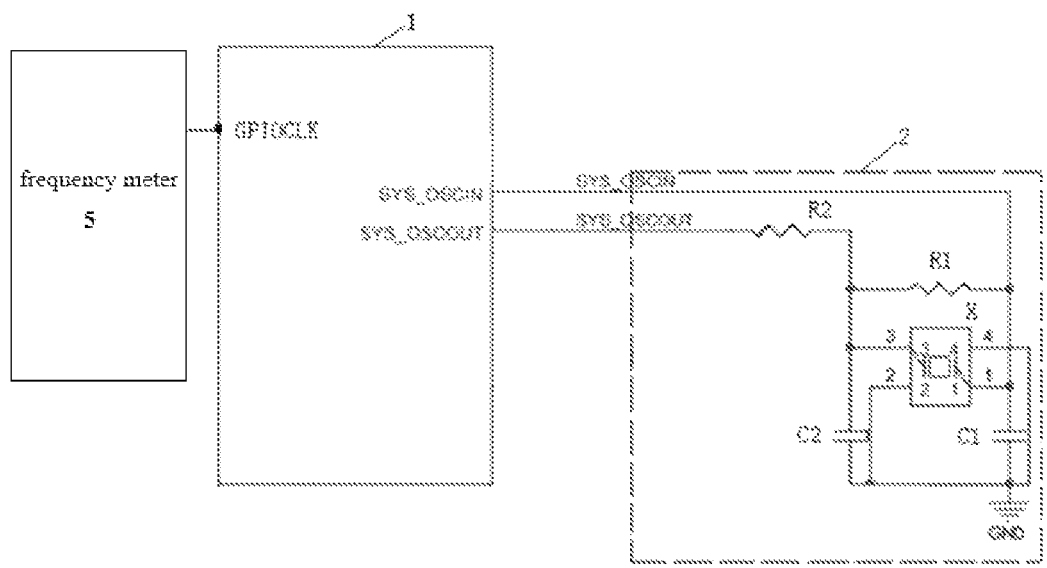
FIG. 2 is a schematic diagram of a CPU according to a preferred embodiment of the present invention.

As shown in FIGS. 1 and 2, a method for calibrating crystal frequency offset through an internal loop 1 of a central processing unit (CPU), wherein the CPU comprises the internal loop 1 and a crystal circuit 2, wherein the method comprises:

Step S1, outputting an oscillation exciting signal to the crystal circuit 2 by the CPU through SYS_CSOOUT;

Step S2, producing a clock signal according to the output signal by the crystal circuit 2, and receiving the clock signal through SYS_CSOIN by the internal loop 1;

Step S3, outputting the clock signal through an output port (GPIOCLK) arranged on the CPU by the internal loop 1; and Step S4, adopting a frequency meter 5 and connecting the frequency meter 5 to the output port, and receiving the clock signal and testing the clock signal by the frequency meter 5, to obtain a testing result;

determining whether a deviation of the clock signal is qualified according to the testing result by a tester;

if the result shows that the deviation of the clock signal is qualified, the tester exits subsequently;

if the result shows that that the deviation of the clock signal is unqualified, the tester regulates the crystal circuit 2, and then turning to Step S4.

In this embodiment, the clock is extracted out from inside and is tested by using a frequency meter 5, which will not affected by the probe, and the measurement is more accurate.

In a preferred embodiment, the crystal circuit 2 comprises: a passive crystal oscillator X, wherein a first pin of the passive crystal oscillator X is configured to input the clock signal to the internal loop 1, a third pin of the passive crystal oscillator X is configured to receive the oscillation exciting signal output from the CPU 1, wherein a second pin and a fourth pin of the passive crystal oscillator X are respectively grounded;

a first resistor R1, wherein the first resistor R1 is connected in parallel with the circuit between the third pin and the fourth pin of the passive crystal oscillator X;

a second resistor R2, wherein the third pin of the passive crystal oscillator X is connected to the internal loop 1 through the second resistor R2;

a first capacitor C1, the first pin of the passive crystal oscillator X is grounded through the first capacitor C1; and a second capacitor C2, the third pin of the passive crystal oscillator X is grounded through the second capacitor C2.

In a preferred embodiment, the first capacitor C1 is directly connected to the ground; and the second capacitor C2 is directly connected to the ground.

In a preferred embodiment, in Step S4, for the step of the tester regulating the crystal circuit 2 further comprises:

Step 4a, regulating a capacitance value of the first capacitor C1 and/or the second capacitor C2, respectively.

In this embodiment, as shown in FIG. 2, a part on the right side is the crystal circuit 2 of the CPU, and a part on the left side is the internal loop 1 of the CPU. It can be seen that the crystal signal SYS_OSCIN can be directly output to the CLKOUT on the left. The clock of the crystal can be measured by the frequency meter, and the load capacitances (the first capacitor C1 and the second capacitor C2) are adjusted to make the clock have a small offset.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A method for calibrating crystal frequency offset through an internal loop of a central processing unit (CPU), wherein the CPU comprises the internal loop and a crystal circuit, wherein the method comprises:
    Step S1, outputting an oscillation exciting signal to the crystal circuit by the CPU;
    Step S2, producing a clock signal according to the oscillation exciting signal by the crystal circuit;
    Step S3, outputting the clock signal through an output port arranged on the CPU by the internal loop; and
    Step S4, adopting a frequency meter and connecting the frequency meter to the output port, and receiving the clock signal and testing the clock signal by the frequency meter, to obtain a testing result;
    determining whether a deviation of the clock signal requires a regulation of the crystal circuit according to the testing result;
    regulating the crystal circuit if the determining shows that the deviation of the clock signal requires regulation of the crystal circuit, then return to Step S4;
    wherein the crystal circuit comprises:
    a passive crystal oscillator, wherein a first pin of the passive crystal oscillator is configured to input the clock signal to the internal loop, a third pin of the passive crystal oscillator is configured to receive the oscillation exciting signal output from the CPU, wherein a second pin and a fourth pin of the passive crystal oscillator are respectively grounded;
    a first resistor, wherein the first resistor is connected in parallel with the crystal circuit between the third pin and the fourth pin of the passive crystal oscillator;
    a second resistor, wherein the third pin of the passive crystal oscillator is connected to the internal loop through the second resistor;
    a first capacitor, the first pin of the passive crystal oscillator is grounded through the first capacitor; and
    a second capacitor, the third pin of the passive crystal oscillator is grounded through the second capacitor.

2. The method as claimed in claim 1, wherein the first capacitor is directly connected to the ground; and the second capacitor is directly connected to the ground.

3. The method as claimed in claim 1, wherein in Step S4, the step of regulating the crystal circuit further comprises:

Step 4*a*, regulating a capacitance value of the first capacitor and/or the second capacitor, respectively.

\* \* \* \* \*